US011377590B2

(12) United States Patent
Lhuillier et al.

(10) Patent No.: US 11,377,590 B2
(45) Date of Patent: Jul. 5, 2022

(54) METHOD OF PREPARATION OF NANOPARTICLES USING MERCURY THIOLATE COMPOUNDS

(71) Applicants: NEXDOT, Romainville (FR); CENTRE NATIONAL DE LA RECHERCHE SCIENTIFIQUE, Paris (FR); SORBONNE UNIVERSITE, Paris (FR)

(72) Inventors: Emmanuel Lhuillier, Paris (FR); Nicolas Goubet, Limeil-Brévannes (FR)

(73) Assignees: NEXDOT, Romainville (FR); CENTRE NATIONAL DE LA RECHERCHE SCIENTIFIQUE, Paris (FR); SORBONNE UNIVERSITE, Paris (FR)

( * ) Notice: Subject to any disclaimer, the term of this patent is extended or adjusted under 35 U.S.C. 154(b) by 0 days.

(21) Appl. No.: 17/024,878

(22) Filed: Sep. 18, 2020

(65) Prior Publication Data

US 2021/0087462 A1 Mar. 25, 2021

(30) Foreign Application Priority Data

Sep. 19, 2019 (EP) .................... 19306130

(51) Int. Cl.
| | | |
|---|---|---|
| C09K 11/02 | (2006.01) | |
| C01B 19/00 | (2006.01) | |
| C01G 13/00 | (2006.01) | |
| C09K 11/89 | (2006.01) | |
| H01L 31/0296 | (2006.01) | |

(52) U.S. Cl.
CPC .......... *C09K 11/025* (2013.01); *C01B 19/007* (2013.01); *C01G 13/00* (2013.01); *C09K 11/892* (2013.01); *H01L 31/0296* (2013.01); *C01P 2004/64* (2013.01)

(58) Field of Classification Search
CPC .... C09K 11/025; C09K 11/892; C01G 13/00; C01B 19/007
See application file for complete search history.

(56) References Cited

FOREIGN PATENT DOCUMENTS

| WO | WO 2006/053662 | * | 5/2006 |
| WO | 2019/068814 A1 | | 4/2019 |
| WO | WO 2019/068814 | * | 4/2019 |

OTHER PUBLICATIONS

Translation for WO 2006/053662, May 26, 2006.*
European Search Report dated Jan. 17, 2020 in corresponding application No. EP19306130; 3 pgs.
Menglu Chen et al: "High Carrier Mobility in HgTe Quantum Dot Solids Improves Mid-IR Photodetectors", ACS Photonics, vol. 6, No. 9, Sep. 18, 2019 (Sep. 18, 2019), pp. 2358-2365, 8 pgs.
Jun Lee et al: "Large-scale synthesis of highly emissive and photostable CuInS2/ZnS nanocrystals through hybrid flow reactor", Nanoscale Research Letters, vol. 9, No. 1, Dec. 17, 2014 (Dec. 17, 2014), 8 pgs.

* cited by examiner

*Primary Examiner* — C Melissa Koslow
(74) *Attorney, Agent, or Firm* — Maier & Maier, PLLC

(57) ABSTRACT

A method of preparation of mercury chalcogenide nanoparticles that includes the steps of providing a precursor of mercury and mixing the precursor of mercury with a precursor of chalcogenide, wherein the precursor of mercury is a mercury thiolate. Also, mercury telluride nanoparticles and their use in an IR photodetector, an IR photoconversion device, an IR filter or an IR photodiode.

20 Claims, 11 Drawing Sheets

METHOD OF PREPARATION OF NANOPARTICLES USING MERCURY THIOLATE COMPOUNDS

FIELD

The present invention pertains to the field of nanocrystals with absorption properties in infrared range. In particular, the invention relates to mercury chalcogenide nanocrystals and a method to produce them from mercury thiolate compound.

BACKGROUND

Colloidal quantum dots (CQD) have striking properties in terms of light absorption and light emission properties. Control of size of these objects allows to design nanoparticles with varying bandgap energies, thus defining in which range of electromagnetic spectrum these nanoparticles will interact. Applications of such nanoparticles range from light emitters (LED, displays) to sensors and photoreceptors.

Two types of material have been considered for the design material interacting in infrared range of wavelength: lead (Pb) chalcogenides and mercury (Hg) chalcogenides. Lead chalcogenides (PbS, PbSe and PbTe) offer a limited spectral tunability due to their bulk band gap. Mercury chalcogenides are semimetal as bulk material and the energy of their infrared transition can potentially be reduced to zero. They consequently offer a much larger tunability and have raised much interest for infrared devices.

Chen et al. discloses HgTe quantum dots having a confinement energy less than 5000 $cm^{-1}$ and having a ratio of electron mobility and hole mobility greater than 1 (ACS Photonics, vol. 6, no. 9, p. 2358-2365). WO 2019/068814 discloses nanoparticles having a confinement energy greater than 5000 $cm^{-1}$ and does not disclose that these nanoparticles a ratio of electron mobility and hole mobility greater than 1.

However, current synthesis of mercury chalcogenide nanoparticles suffers from several drawbacks. Mercury precursors are usually based on $Hg^{II}$, which is highly toxic. In addition, it is difficult to obtain dispersions of mercury chalcogenide nanoparticles with high concentration. This is a major drawback in view of large-scale synthesis and access to cost effective products.

It is an object of the invention to provide with a method yielding concentrated dispersions of nanoparticles, optionally using mercury at oxidation state zero, i.e. less toxic than $Hg^{II}$.

Mercury telluride nanoparticles with improved properties have been also obtained.

SUMMARY

This invention thus relates to a method of preparation of mercury chalcogenide nanoparticles HgX comprising the steps of providing a precursor of Hg and mixing said precursor of Hg with a precursor of X, wherein precursor of Hg is a Hg thiolate and X is a chalcogenide.

In an embodiment, mixing is done in a coordinating solvent, preferably an amine, more preferably oleylamine.

In an embodiment, X is a chalcogenide selected from Tellurium (Te), Selenium (Se) and Sulphur (S), preferably X is Te.

In an embodiment, precursor of X is selected from trioctylphosphine telluride (TOPTe); ammonium sulfide $(NH_4)_2S$ and elemental Se.

In an embodiment, Hg thiolate is a salt of Hg at oxidation state +II.

In an embodiment, Hg thiolate is prepared by reaction of liquid Hg with thiol, preferably under sonication conditions.

In an embodiment, an oxidizing agent is added during reaction of liquid Hg with thiol, preferably oxidizing agent is iodine $I_2$.

The invention also relates to HgTe nanoparticles having a confinement energy greater than 5000 $cm^{-1}$ and having a ratio of electron mobility and hole mobility greater than 1, preferably greater than 5. Preferably, these HgTe nanoparticles are capped with thiols.

The invention also relates to HgTe nanoparticles having a confinement energy less than 4000 $cm^{-1}$ and having a ratio of electron mobility and hole mobility less than 1, preferably less than 0.1. Preferably, these HgTe nanoparticles are capped with thiols.

The invention also relates to the use of said HgTe nanoparticles in an IR photodetector, an IR photoconversion device, an IR filter or an IR photodiode.

The invention finally relates to an optoelectronic device comprising said HgTe nanoparticles, preferably optoelectronic device is selected from an IR photodetector, an IR photoconversion device, an IR filter or an IR photodiode.

DETAILED DESCRIPTION

Figure 1:
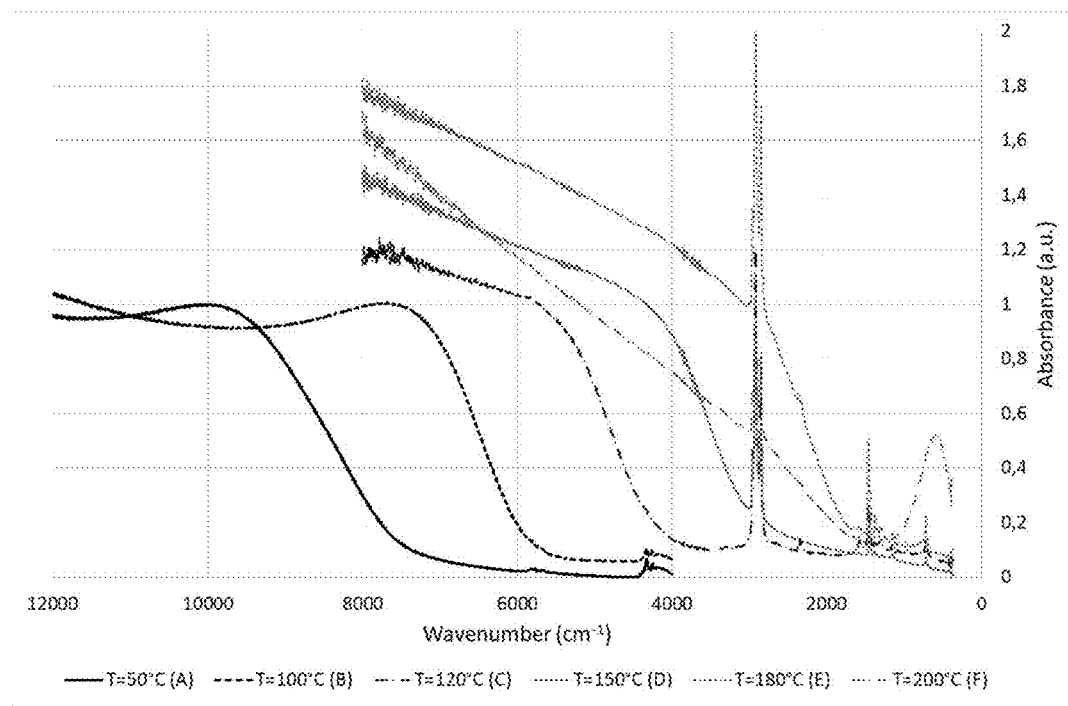
FIG. 1 shows absorption spectra (arbitrary unit) as a function of wavenumber ($cm^{-1}$) of HgTe nanoparticles obtained via salt-route for temperatures of 50° C. (A), 100° C. (B), 120° C. (C), 150° C. (D), 180° C. (E) and 200° C. (F).

In the present invention, the following terms have the following meanings:

"Hg" is the chemical symbol for mercury element.

"HgX" refers to mercury chalcogenide material. The stoichiometry of HgX is not strictly limited to 1:1 but includes slight variations in composition due to nanometric size of nanoparticles, crystalline face effect and potentially doping. Actually, HgX defines material with Hg content in atomic composition between 48% and 55%; with X content in atomic composition between 45% and 52%; and with atomic composition of compounds different from Hg or X from 0.001% to 5%. For instance, the following compositions are HgX according to this definition: 47.9% Te/52.1% Hg; 46.5% Te/53.5% Hg; 48.7% Te/51.2% Hg/0.1Au.

"Infrared" refers to range of light having wavelength from 780 nm to 1 mm. This range is usually split in three sub ranges. Near Infrared (NIR) corresponds to wavelength from 780 nm to 1400 nm. Short-Wavelength Infrared (SWIR) corresponds to wavelength from 1400 nm to 3000 nm. Mid-wavelength Infrared (MWIR), also called Intermediate Infrared, corresponds to wavelength from 3000 nm to 5000 nm.

"Ratio of electron mobility and hole mobility" refers to the ratio defined by mobility of electron divided by mobility of holes in a semiconducting material.

"Wavenumber" is defined as the inverse of wavelength (in cm$^{-1}$). A wavenumber of 5.10$^3$ cm$^{-1}$ corresponds to a wavelength of 2 µm. Wavenumbers are very often used in spectroscopy and define energy. In such case, wavenumber corresponds to the energy of light having such wavenumber. When a nanoparticle is defined with its wavenumber, it means that energy band gap of the nanoparticle, in other words confinement energy, corresponds to this wavenumber.

This invention relates to a method of preparation of HgX nanoparticles. A Hg precursor is first provided then mixed with a precursor of chalcogen X, yielding HgX nanoparticles.

In the invention, Hg precursor is a Hg thiolate.

In an embodiment, mixing of Hg precursor and precursor of chalcogen X is done in a solvent. Preferably, the solvent is an amine. Suitable solvents are propylamine, butylamine, heptadiamine, octylamine, oleylamine, dodecylamine, octadecylamine, tetradecylamine, aniline, 1,6-hexanediamine, or mixture thereof. More preferably, solvent is oleylamine. It has been surprisingly observed that amine solvent leads to a narrow size distribution of nanoparticles, i.e. monodisperse nanoparticles, and an improved colloidal stability, i.e. lower aggregation of nanoparticles.

Chalcogen X may be selected from Oxygen (O), Sulphur (S), Selenium (Se) and Tellurium (Te). Preferred chalcogen are S, Se and Te. Most preferred chalcogen is Te. Using Tellurium as chalcogen allows preparing nanoparticles with absorption properties in infrared range, in particular nanoparticles with a diameter in the range from 3 nm to 20 nm, and optical features in the range from 1 micrometer to 20 micrometer.

Precursor of Sulphur (S) may be selected from solid sulfur; thioacetamide and their derivatives; sulfur oxides; tri-n-alkylphosphine sulfide such as tri-n-butylphosphine sulfide or tri-n-octylphosphine sulfide; hydrogen sulfide H$_2$S; thiols such as n-butanethiol, n-octanethiol or n-dodecanethiol; diethylsulfide; methylallylsulfide; salts such as magnesium sulfide, calcium sulfide, sodium sulfide, potassium sulfide; or mixture thereof. A preferred precursor of Sulphur (S) is ammonium sulfide (NH$_4$)$_2$S.

Precursor of Selenium (Se) may be selected from solid selenium; selenourea and their derivatives; tri-n-alkylphosphine selenide such as tri-n-butylphosphine selenide or tri-n-octylphosphine selenide; selenium disulfide SeS$_2$; selenium oxide SeO$_2$; hydrogen selenide H$_2$Se; diethylselenide; methylallylselenide; salts such as magnesium selenide, calcium selenide, sodium selenide, potassium selenide; or a mixture thereof. A preferred precursor of Selenium (Se) is elemental selenium.

Precursor of Tellurium (Te) may be selected from solid tellurium; trioctylphosphine telluride; tellurium oxide or a mixture thereof. A preferred precursor of Tellurium (Te) is trioctylphosphine telluride (TOPTe).

In an embodiment, Hg thiolate is a salt of Hg at oxidation state +II. Hg thiolate may be obtained by mixing Hg$^{2+}$ salt with a thiol. Any mercury salt may be used, in particular HgCl$_2$, HgBr$_2$, HgI$_2$, HgSCN$_2$, HgO, mercury acetate, mercury sulfate, mercury trifluoroacetate, mercury nitrate, mercury perchlorate or a mixture thereof. Any thiol may be used, in particular methanethiol, ethanedithiol, propanethiol, octanethiol, dodecanethiol, octadecanethiol, decanethiol, or mixture thereof. Dodecanethiol (DDT) is preferred as it increases colloidal stability of HgX nanoparticles further prepared.

Hg thiolate is preferably purified, for instance by recrystallization, to avoid presence of impurities that could limit final properties of HgX nanoparticles.

Alternatively, Hg thiolate is prepared by reaction of liquid Hg with thiol, preferably under sonication conditions. It has been surprisingly observed that mercury thiolate crystals are obtained in such conditions, together with mercury droplets dispersed in solvent. These crystals may be separated or may be used in further synthesis steps directly. In a configuration of this embodiment, an oxidizing agent is added during reaction of liquid Hg with thiol, preferably oxidizing agent is a soft oxidant like iodine 12. Oxidizing agent converts $Hg^0$ into $Hg^{2+}$ which will be engaged in reaction with precursor of X to obtain HgX nanoparticles.

In this embodiment, highly toxic $Hg^{2+}$ compound is prepared in-situ, lowering exposure of operators and limiting production of toxic by-products.

Figure 17:
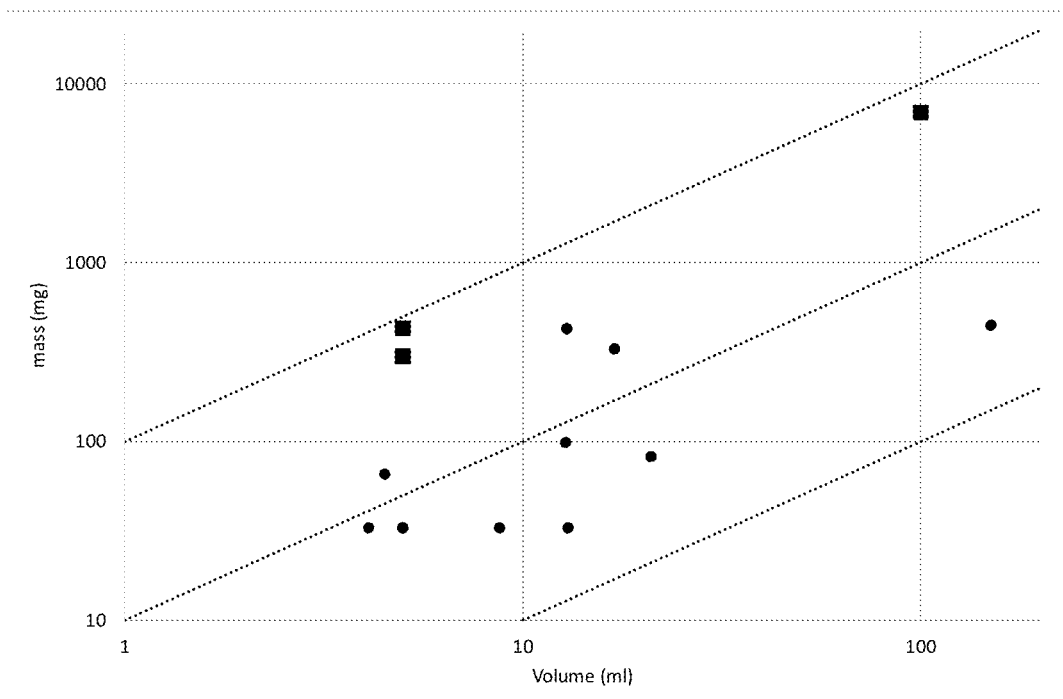
FIG. 17 compares concentration of HgTe nanoparticles obtained in invention (squares) and in prior art (circles). Each point corresponds to the mass of HgTe nanoparticles obtained (in mg) as a function of solvent volume in which HgTe nanoparticles are obtained. Dotted lines correspond to concentrations of 1 g·L$^{-1}$; 10 g·L$^{-1}$ and 100 g·L$^{-1}$.

Hg thiolate obtained by both methods is soluble in coordinating solvent used, in particular in oleylamine. This opens an opportunity to prepare concentrated solutions of mercury precursors, then concentrated dispersions of mercury chalcogenide nanoparticles. FIG. 17 compares HgTe nanoparticles yield (in mass obtained versus volume of solvent used in various scales of experiments, i.e. concentration. Note that scale is log-log) obtained with method of invention and obtained in prior art. With inventive method concentration are increased by a factor 5 to 50, reaching almost 100 g/L.

The invention also relates to HgTe nanoparticles with unexpected properties. HgTe nanoparticles may be characterized by two parameters. First, diameter of the nanoparticle is highly relevant. This diameter is directly linked with the confinement energy (bandgap) of the nanoparticle. Hence, HgTe nanoparticles may be ordered in diameter from confinement energy (measured in wavelength number): the larger the diameter, the lower the confinement energy. When nanoparticles become too large (above 40 nm for HgTe nanoparticles), quantum effect disappears and confinement energy falls to zero. Second, charge mobility, i.e. electron mobility and hole mobility, in nanoparticles defines their properties. Measure of charge mobility is easily done with a field effect transistor in which channel is prepared with HgTe nanoparticles. By variation of potential between gate and source, one modifies charge density of HgTe nanoparticles and resulting current between source and drain gives access to mobility of charges.

In HgTe nanoparticles known in the art, the ratio of electron mobility and hole mobility is usually greater than 1 for nanoparticles having a confinement energy lower than 4500 $cm^{-1}$; or the ratio of electron mobility and hole mobility is usually less than 0.1 for nanoparticles having a confinement energy greater than 5000 $cm^{-1}$.

Surprisingly, HgTe nanoparticles obtained with process described above have different characteristics.

In particular, HgTe nanoparticles having a confinement energy greater than 5000 $cm^{-1}$ and having a ratio of electron mobility and hole mobility greater than 1, preferably greater than 5 have been obtained. Such HgTe nanoparticles are n-type semiconductors and their photoelectric properties are active within infrared range of wavelength from 1 μm to 2 μm. These HgTe nanoparticles are noted HgTe-n hereafter. The domain of confinement energy and ratio of electron mobility and hole mobility of these HgTe-n is illustrated on FIG. 16 (dashed square).

Besides, HgTe nanoparticles having a confinement energy less than 4500 $cm^{-1}$ and having a ratio of electron mobility and hole mobility less than 1, preferably less than 0.1 have been obtained. Such HgTe nanoparticles are p-type semiconductors and their photoelectric properties are active within infrared range of wavelength greater than 2 μm and up to 5 μm. These HgTe nanoparticles are noted HgTe-p hereafter. The domain of confinement energy and ratio of electron mobility and hole mobility of these HgTe-p is illustrated on FIG. 16 (dotted square).

Preferably, said HgTe nanoparticles surface is capped with thiols. This surface modification provides with an increased colloidal stability, i.e. lower nanoparticle aggregation and improved redispersion of nanoparticles after drying. Colloidal stability is critical in concentrated dispersions: as concentration increases, aggregation tends to occur more quickly and irreversibly. With the method of the invention, yielding concentrated dispersions of HgX nanoparticles, improving colloidal stability is therefore required.

In addition, the invention also relates to the use of HgTe-n and/or HgTe-p nanoparticles in an IR photodetector, an IR photoconversion device, an IR filter or an IR photodiode.

Finally, the invention also relates to an optoelectronic device comprising HgTe-n and/or HgTe-p nanoparticle. Preferably, optoelectronic device is selected from an IR photodetector, an IR photoconversion device, an IR filter or an IR photodiode.

While various embodiments have been described and illustrated, the detailed description is not to be construed as being limited hereto. Various modifications can be made to the embodiments by those skilled in the art without departing from the true spirit and scope of the disclosure as defined by the claims.

EXAMPLES

The present invention is further illustrated by the following examples.

Nanoparticle Synthesis

Example 1: Synthesis of 1M TOPTe Precursor 2.54 g of Tellurium (Te) powder are mixed in 20 mL of trioctylphosphine (TOP) in a three-neck flask. The flask is put under vacuum at room temperature for 1 hour. The atmosphere is then switched to Argon and the temperature is raised to 275° C. The solution is stirred until a clear orange solution is obtained. The flask is then cooled down and the color switches to yellow. At room temperature, the flask is degassed again for 10 min. Finally, this solution of trioctylphosphine Telluride (TOPTe) is transferred to an air free glove box for storage.

Example 2: Synthesis of HgTe Nanocrsytal from Mercury Thiolate—Salt Route 3.18 g of mercury acetate are dissolved in 150 mL of water. The mercury solution is then added to a solution of 5 mL of dodecanethiol (DDT) in 250 mL of ethanol. Mercury dodecylthiolate $Hg(DDT)_2$ precipitates immediately in white powder. After decantation, the solid product is filtered and washed several times with ethanol (150 mL). The white powder is dried and recrystallized in hot toluene.

0.6 g of $Hg(DDT)_2$ is dissolved in 4 mL of oleylamine (OLA) and degassed at 100° C. during 10 min. Under Argon atmosphere, 1 mL of TOPTe solution of concentration 1 mol/L is injected to the $Hg(DDT)_2$ solution at the 50° C. The solution immediately turns from colorless to black-brown color when HgTe nanoparticles are formed. After 1 min, 1 mL of dodecanethiol is injected to quench the reaction. HgTe nanocrystals are precipitated with 10 mL of methanol. After precipitation, the nanocrystals are redispersed with 2 mL of chloroform and few drops of dodecanethiol. The two previous steps are repeated twice with 5 mL of methanol. Finally, HgTe nanocrystals are redispersed in chloroform.

Figure 2A:
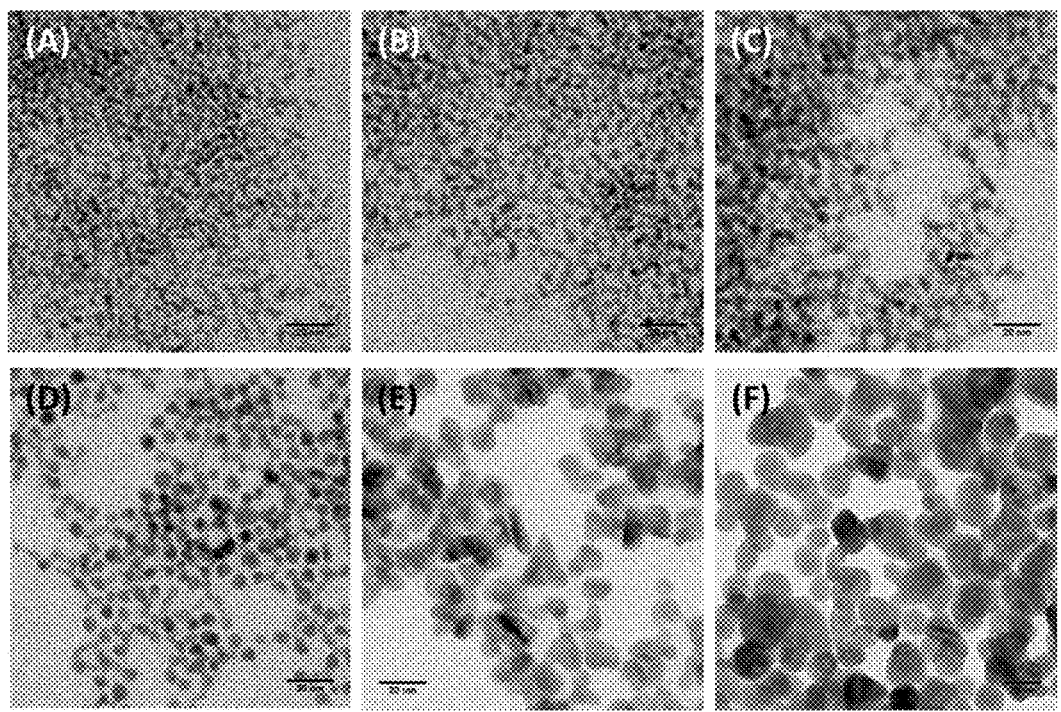
FIG. 2a is a TEM photograph showing HgTe nanoparticles obtained via salt-route for temperatures of 50° C. (A), 100° C. (B), 120° C. (C), 150° C. (D), 180° C. (E) and 200° C. (F). Bar is 20 nm.

Synthesis is reproduced except that temperature of injection of TOPTe is changed to 100° C., 120° C., 150° C., 180° C. and 200° C. FIG. 1 shows absorbance (in arbitrary units) of HgTe nanocrystals obtained at various temperatures. FIG. 2a shows TEM pictures of these HgTe nanocrystals. Table 1 shows atomic composition of HgTe nanocrystals, measured by EDX analysis and confinement energy.

TABLE 1

|  | 50° C. | 100° C. | 120° C. | 150° C. | 180° C. | 200° C. |
|---|---|---|---|---|---|---|
| Te (% at) | 46.5 | 47.2 | 46.9 | 47.9 | 49.2 | 49.4 |
| Hg (% at) | 53.5 | 52.8 | 53.1 | 52.1 | 50.8 | 50.6 |
| Confinement energy (cm$^{-1}$) | NA | 7720 | 5570 | 4370 | 2770 | 570 |

Figure 2B:
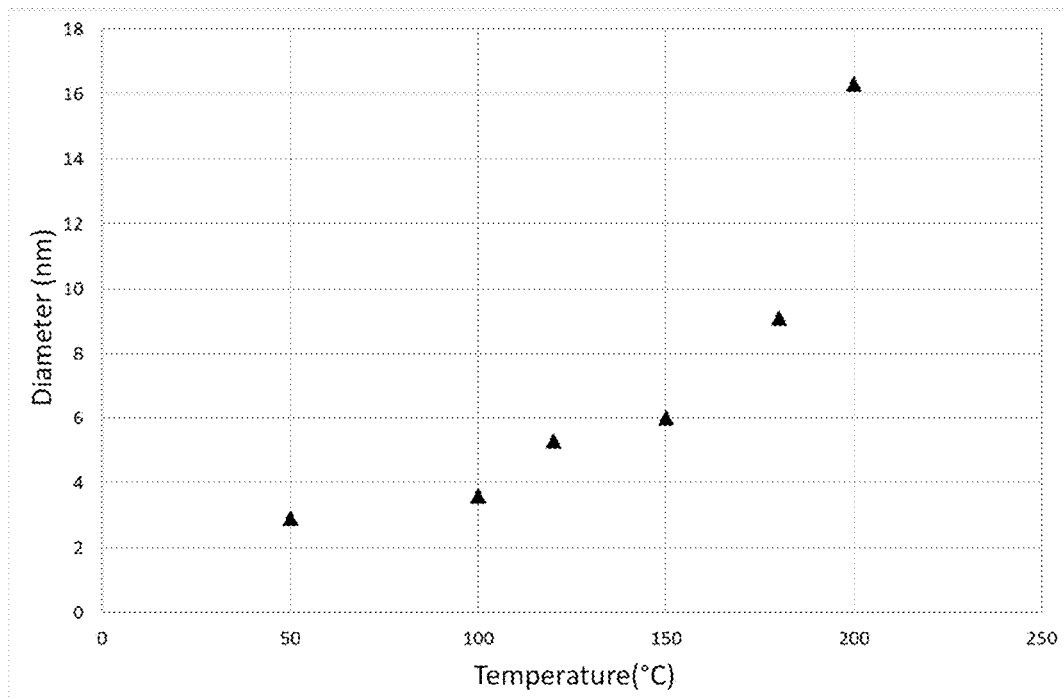
FIG. 2b shows diameter of HgTe nanoparticles obtained via salt-route for 50° C. (A), 100° C. (B), 120° C. (C), 150° C. (D), 180° C. (E) and 200° C. (F).

FIG. 2b shows diameter (in nm) of HgTe nanocrystals (circles) as a function of reaction temperature (in ° C.). Selection of temperature provides with a direct control on size of nanocrystals.

One may observe that increasing temperature leads to larger nanoparticles. At 200° C., HgTe nanoparticles obtained present an additional intra-band feature (about 17 nm).

Example 3: Synthesis of HgTe Nanocrsytal from Mercury Thiolate—Liquid Mercury Route 0.2 g of liquid mercury is dissolved under sonication (50 W, 45 kHz) in 2 mL of dodecanethiol during 15 min. The solution turns to colorless to metallic grey color. 2 mL of oleylamine and 26 mg of iodine $I_2$ is added to the mercury solution and degassed at room temperature during 15 min. Slight discoloration is observed during degassing step. Under argon atmosphere, 1 mL of TOPTe solution of concentration 1 mol/L is injected to the mercury solution at 50° C. The solution color turns from grey to black-brown solution when HgTe nanoparticles are formed. After 1 min, 1 mL of dodecanethiol is injected to quench the reaction. Nanocrystals are precipitated with 10 mL of methanol. After precipitation, the nanocrystals are redispersed with 2 mL of chloroform and few drops of dodecanethiol. The precipitation step is repeated with 5 mL of methanol. Finally, nanocrystals are redispersed in chloroform.

Synthesis s reproduced except that temperature of injection of TOPTe is changed to 70° C., 80° C., 100° C., 120° C. and 150° C.

Synthesis was reproduced in larger scale, with following conditions. In a 250 mL tree-necked round flask, 8 g of liquid mercury is dissolved under sonication (50 W, 45 kHz) in 30 mL of dodecanethiol during 8 hours. After adding 1.04 g of iodine $I_2$ and 30 mL of oleylamine, the mercury solution is degassed at room temperature during 30 min. The atmosphere is flushed with argon and put again under vacuum. At 90° C., 40 mL of TOPTe solution of concentration 1 mol/L is injected under vacuum to increase the injection speed and the reaction is conducted during 3 min. The reaction is quenched by adding 20 mL of dodecanethiol. The temperature is decreased with ice bath to room temperature. Nanocrystals are precipitated with 40 mL of methanol. After precipitation, the nanocrystals are redispersed with 20 mL of chloroform and few drops of dodecanethiol. The precipitation step is repeated with 10 mL of methanol Finally, nanocrystals are redispersed in chloroform.

Figure 3:
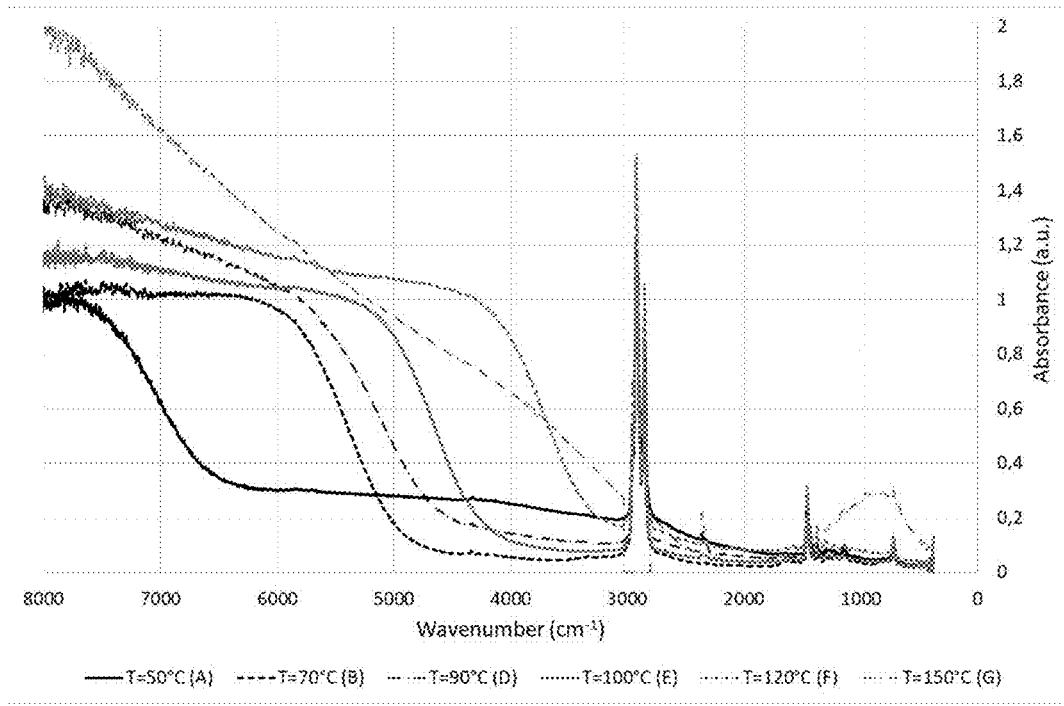
FIG. 3 shows absorption spectra (arbitrary unit) as a function of wavenumber ($cm^{-1}$) of HgTe nanoparticles obtained via liquid mercury route for temperatures of 50° C. (A), 70° C. (B), 90° C. (D), 100° C. (E), 120° C. (F) and 150° C. (G).
Figure 4A:
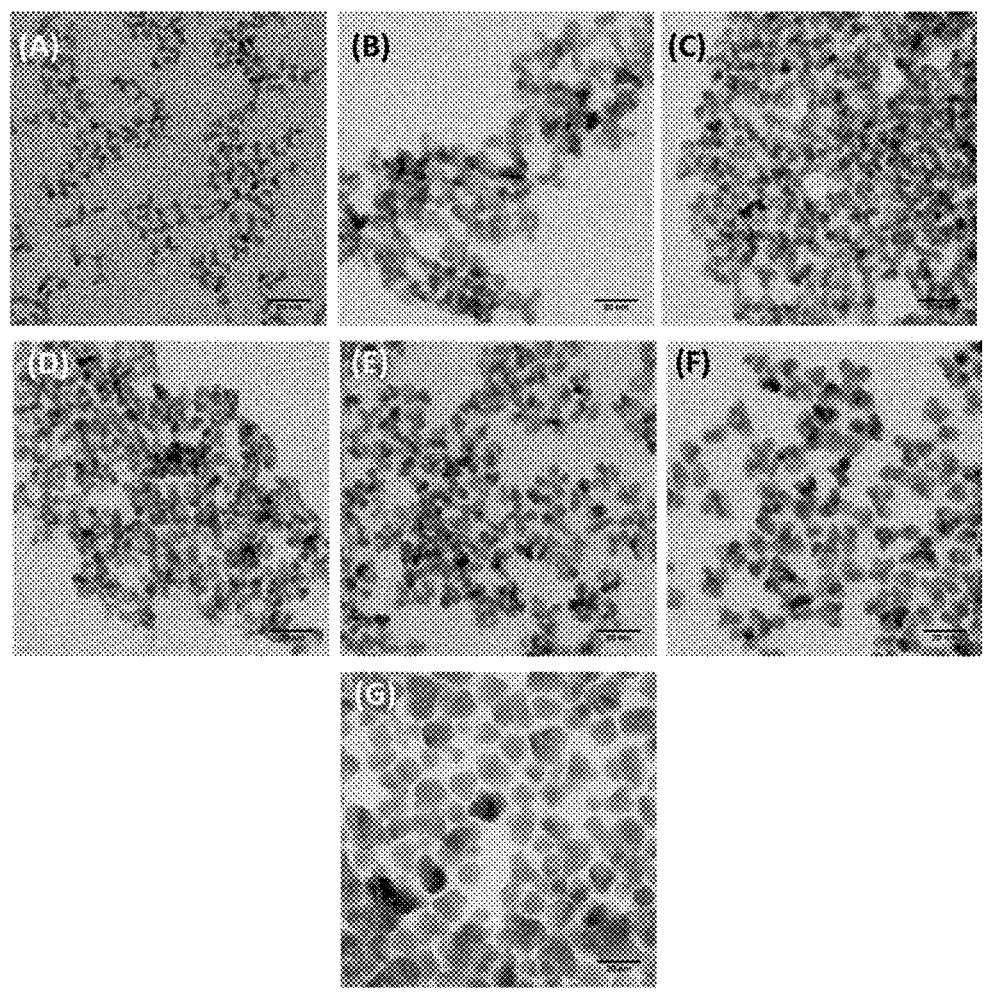
FIG. 4a is a TEM photograph showing HgTe nanoparticles obtained via liquid mercury route for temperatures of 50° C. (A), 70° C. (B), 80° C. (C), 90° C. (D), 100° C. (E), 120° C. (F) and 150° C. (G). Bar is 20 nm.

FIG. 3 shows absorbance (in arbitrary units) of HgTe nanocrystals obtained at various temperatures. FIG. 4a shows TEM pictures of these HgTe nanocrystals. Table 2 shows atomic composition of HgTe nanocrystals measured by EDX analysis and confinement energy.

TABLE 2

|  | 50° C. | 70° C. | 80° C. | 100° C. | 120° C. | 150° C. |
|---|---|---|---|---|---|---|
| Te (% at) | 46.5 | 45.8 | 46.9 | 47.9 | 47.7 | 48.7 |
| Hg (% at) | 53.5 | 54.2 | 53.1 | 52.1 | 52.3 | 51.3 |
| Confinement energy (cm$^{-1}$) | 7500 | 6000 | 5880 | 5200 | 4500 | 870 |

Figure 4B:
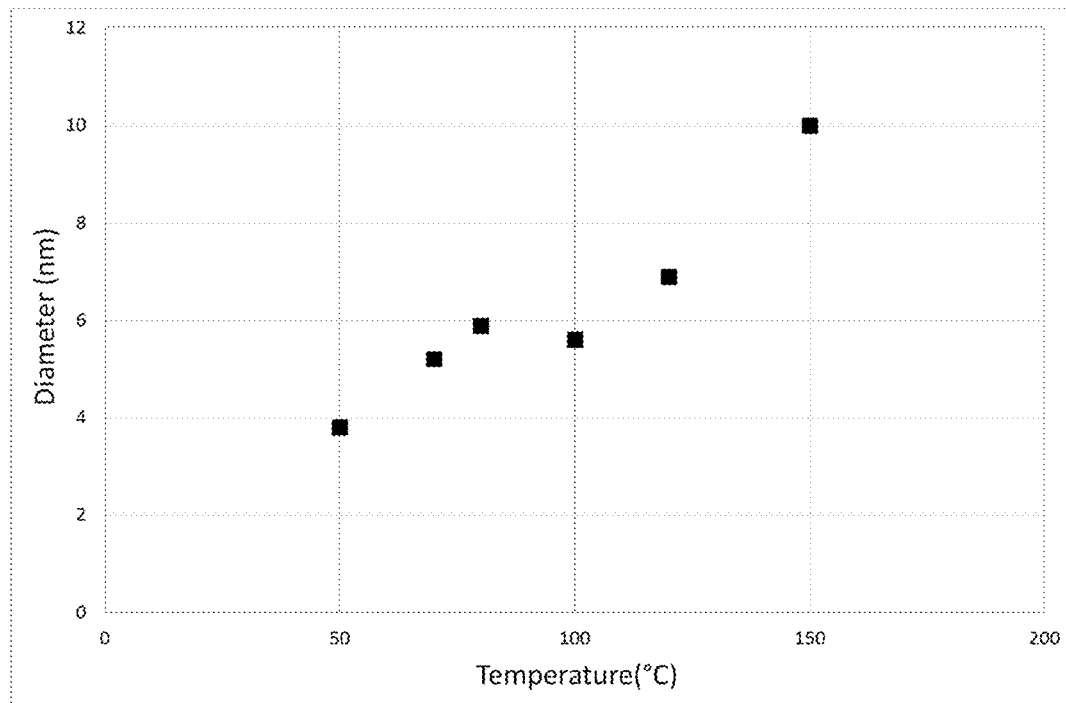
FIG. 4b shows diameter of HgTe nanoparticles obtained via liquid mercury route for temperatures of 50° C. (A), 70° C. (B), 80° C. (C), 100° C. (E), 120° C. (F) and 150° C. (G).

FIG. 4b shows diameter (in nm) of HgTe nanocrystals (squares) as a function of reaction temperature (in ° C.). Selection of temperature provides with a direct control on size of nanocrystals.

One may observe that increasing temperature leads to larger nanoparticles.

From large scale synthesis at 90° C., HgTe nanoparticles have a diameter of 7 nm and absorb selectively at 2 µm, i.e. in the short wavelength infrared range. Such properties are very relevant to prepare optoelectronic devices in the infrared range.

Comparative Example C1

Synthesis of example 2 was reproduced, except that precursor of mercury is not a thiolate, but a chloride salt $HgCl_2$.

Table 3 shows confinement energy of HgTe nanocrystals for synthesis at different temperatures.

TABLE 3

|  | 50° C. | 60° C. | 80° C. | 90° C. | 110° C. | 120° C. |
|---|---|---|---|---|---|---|
| Confinement energy (cm$^{-1}$) | 7200 | 5400 | 4500 | 4300 | 2800 | 2000 |

Example 4: Synthesis of HgSe Nanocrsytal from Mercury Thiolate—Salt Route 0.6 g of mercury dodecylthiolate $Hg(DDT)_2$ (as obtained in example 2) and 26 mg of iodine is dissolved with 2 mL of oleylamine and degassed at 80° C. during 15 min. Under argon atmosphere, 1 mL of dispersed Selenium powder at 1 mol·L$^{-1}$ in DDT/OLA (1:1 volume ratio) is injected to the mercury solution at 100° C. The solution turns from grey to black-brown solution when HgSe nanoparticles are formed. After 1 min, 1 mL of dodecanethiol is injected to quench the reaction. Nanocrystals are precipitated with 10 mL of methanol. After precipitation, the reddish supernatant is discarded and the precipitated nanocrystals are redispersed with 2 mL of chloroform and few drops of dodecanethiol. The precipitation step is repeated with 5 mL of methanol. Finally, nanocrystals are redispersed in chloroform.

Synthesis is reproduced except that temperature of reaction is changed to 80° C.

Figure 5:
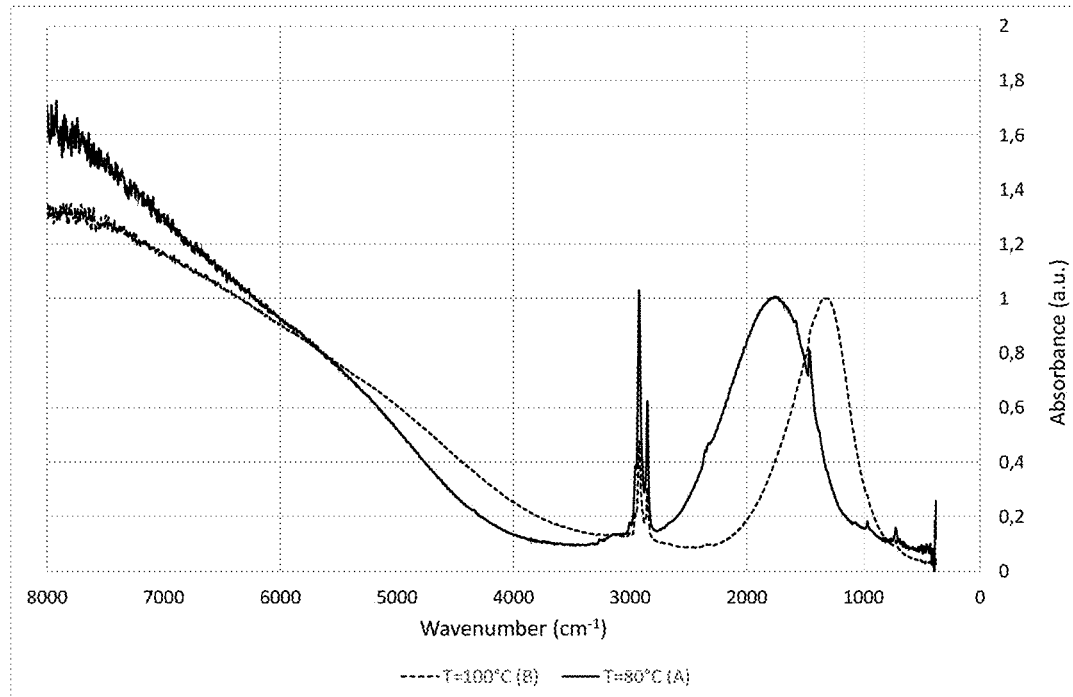
FIG. 5 shows absorption spectra (arbitrary unit) as a function of wavenumber ($cm^{-1}$) of HgSe nanoparticles obtained via salt-route for temperature of 80° C. (A) and 100° C. (B).
Figure 6:
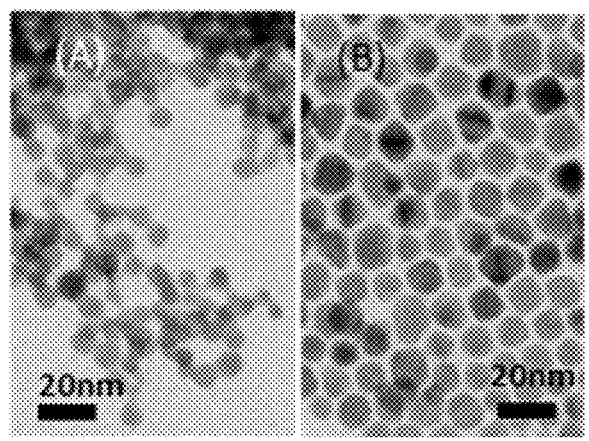
FIG. 6 is a TEM photograph showing HgSe nanoparticles obtained via salt-route for temperature of 80° C. (A) and 100° C. (B). Bar is 20 nm.

FIG. 5 shows absorbance (in arbitrary units) of HgSe nanocrystals obtained at 80° C. and 100° C. FIG. 6 shows TEM pictures of these HgSe nanocrystals.

Figure 7:
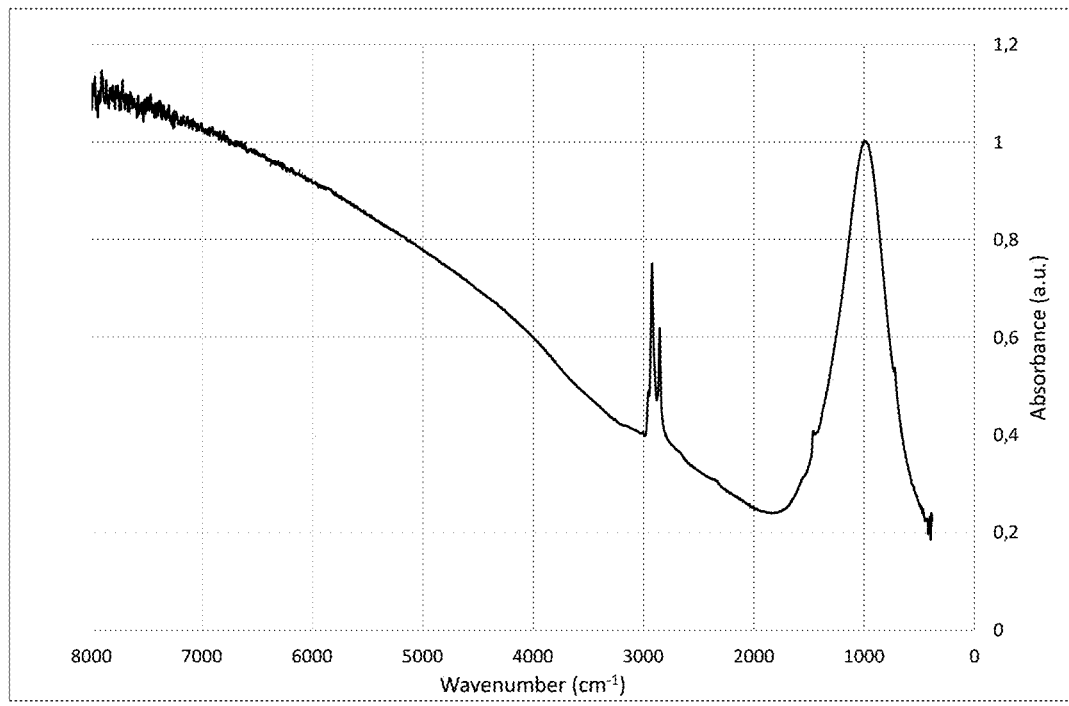
FIG. 7 shows absorption spectra (arbitrary unit) as a function of wavenumber ($cm^{-1}$) of HgSe nanoparticles obtained via liquid mercury route for temperature of 100° C.
Figure 8:
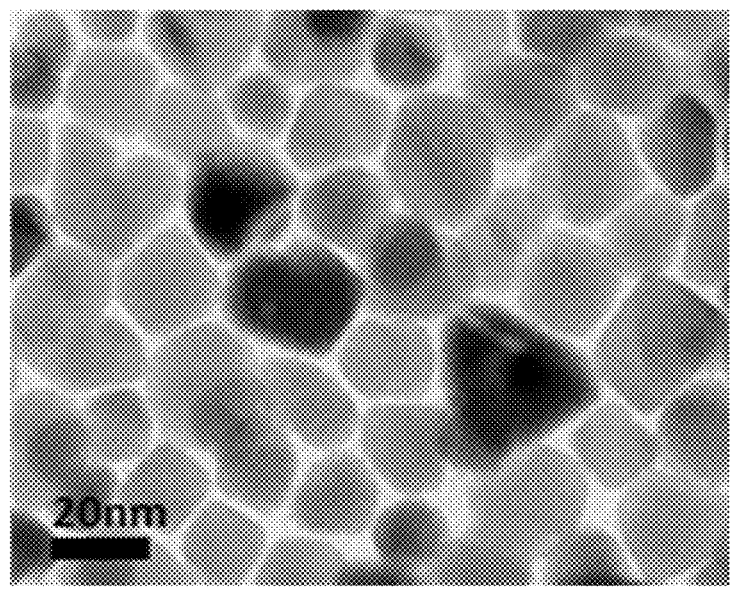
FIG. 8 is a TEM photograph showing HgSe nanoparticles obtained via liquid mercury route for temperature of 100° C. Bar is 20 nm.

Example 5: Synthesis of HgSe Nanocrsytal from Mercury Thiolate—Liquid Mercury Route 0.2 g of liquid mercury is dissolved under sonication (50 W, 45 kHz) in 2 mL of dodecanethiol during 15 min. The solution turns to colorless to metallic grey color. 2 mL of oleylamine and 26 mg of iodine is added to the mercury solution and degassed at room temperature during 15 min. Slight discoloration is observed during degassing step. Under argon atmosphere, 1 mL of dispersed Selenium powder at 1 mol·L$^{-1}$ in DDT/OLA (1:1 volume ratio) is injected to the mercury solution at 100° C. The solution turns from grey to black-brown solution when HgSe nanoparticles are formed. After 1 min, 1 mL of dodecanethiol is injected to quench the reaction. Nanocrystals are precipitated with 10 mL of methanol. After precipitation, the reddish supernatant is discarded and the precipitated nanocrystals are redispersed with 2 mL of chloroform and few drops of dodecanethiol. The precipitation step is repeated with 5 mL of methanol. Finally, nanocrystals are redispersed in chloroform FIG. 7 shows absorbance (in arbitrary units) of HgSe nanocrystals obtained. FIG. 8 shows TEM pictures of these HgSe nanocrystals.

Example 6: Synthesis of HgS Nanocrsytal from Mercury Thiolate—Salt Route 0.6 g of mercury dodecylthiolate Hg(DDT)$_2$ (as obtained in example 2) and 26 mg of iodine is dissolved with 2 mL of oleylamine and degassed at 80° C. during 15 min. Under argon atmosphere, 340 μL of (NH$_4$)$_2$S at 20% wt in water is injected to the mercury solution at 100° C. The solution turns from grey to black-brown solution when HgS nanoparticles are formed. After 1 min, 1 mL of dodecanethiol is injected to quench the reaction. Nanocrystals are precipitated with 10 mL of methanol. After precipitation, the colourless supernatant is discarded and the precipitated nanocrystals are redispersed with 2 mL of chloroform and few drops of dodecanethiol. The precipitation step is repeated with 5 mL of methanol. Finally, nanocrystals are redispersed in chloroform.

Figure 9:
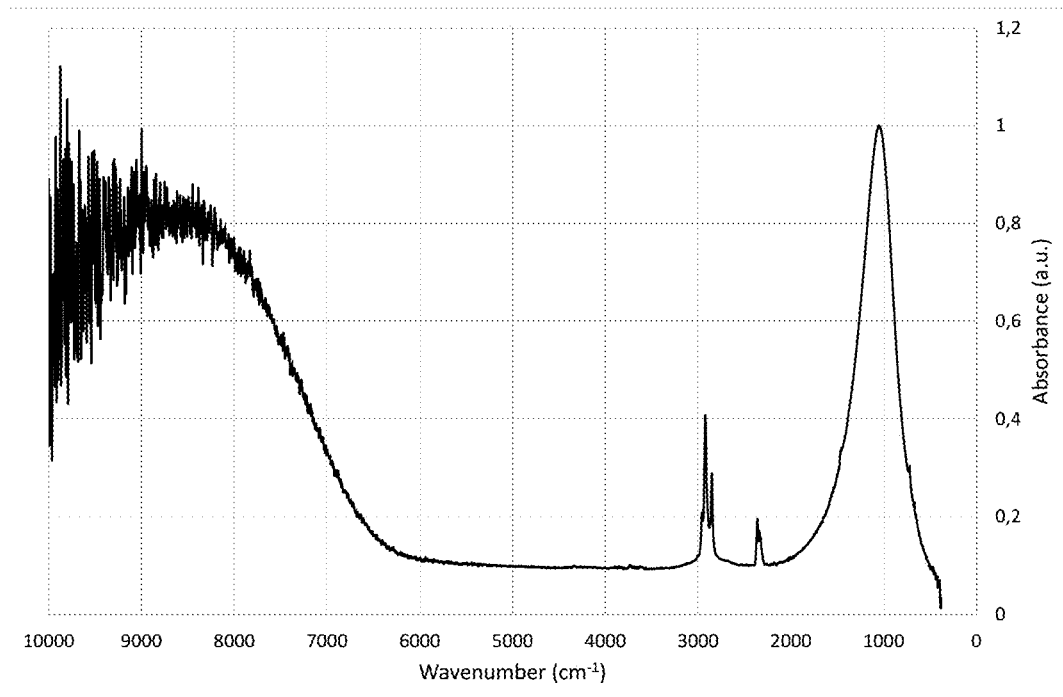
FIG. 9 shows absorption spectra (arbitrary unit) as a function of wavenumber ($cm^{-1}$) of HgS nanoparticles obtained via salt-route for temperature of 100° C.
Figure 10:
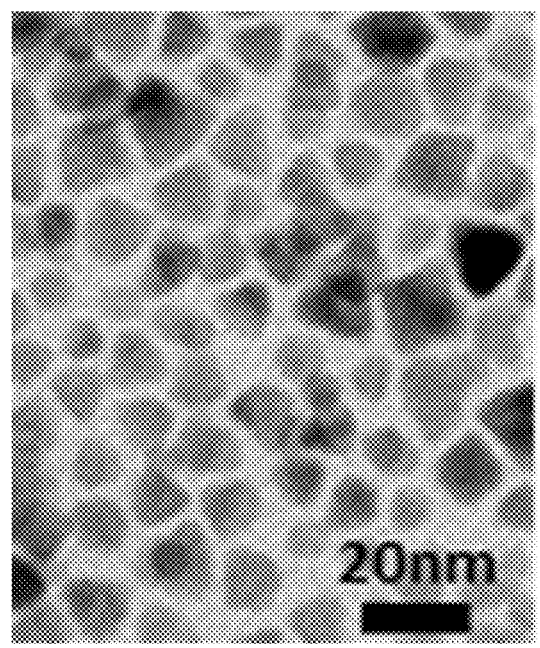
FIG. 10 is a TEM photograph showing HgS nanoparticles obtained via salt-route for temperature of 100° C. Bar is 20 nm.

FIG. 9 shows absorbance (in arbitrary units) of HgS nanocrystals. FIG. 10 shows TEM pictures of these HgS nanocrystals.

Figure 11:
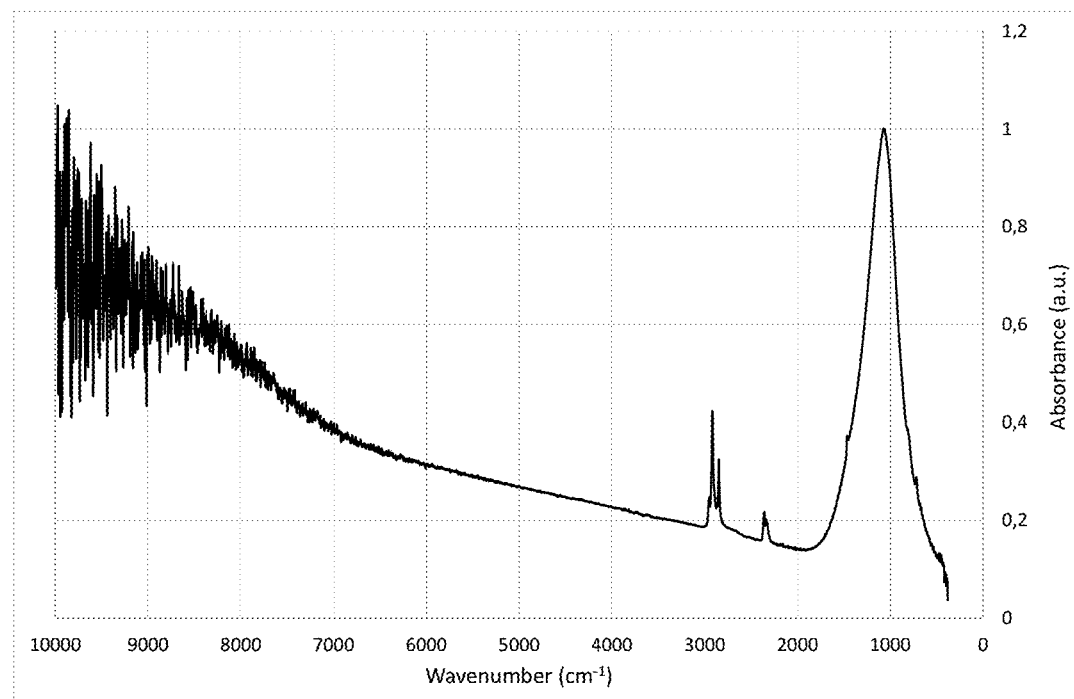
FIG. 11 shows absorption spectra (arbitrary unit) as a function of wavenumber (cm$^{-1}$) of HgS nanoparticles obtained via liquid mercury route for temperature of 100° C.
Figure 12:
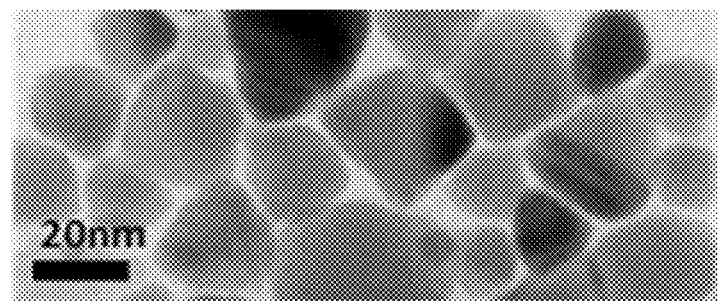
FIG. 12 is a TEM photograph showing HgS nanoparticles obtained via liquid mercury route for temperature of 100° C. Bar is 20 nm.

Example 7: Synthesis of HgS Nanocrsytal from Mercury Thiolate—Liquid Mercury Route 0.2 g of liquid mercury is dissolved under sonication (50 W, 45 kHz) in 2 mL of dodecanethiol during 15 min. The solution turns to colorless to metallic grey color. 2 mL of oleylamine and 26 mg of iodine is added to the mercury solution and degassed at room temperature during 15 min. Slight discoloration is observed during degassing step. Under argon atmosphere, 340 μL of (NH$_4$)$_2$S at 20% wt in water is injected to the mercury solution at 100° C. The solution turns from grey to black-brown solution when HgS nanoparticles are formed. After 1 min, 1 mL of dodecanethiol is injected to quench the reaction. Nanocrystals are precipitated with 10 mL of methanol. After precipitation, the colourless supernatant is discarded and the precipitated nanocrystals are redispersed with 2 mL of chloroform and few drops of dodecanethiol. The precipitation step is repeated with 5 mL of methanol. Finally, nanocrystals are redispersed in chloroform FIG. 11 shows absorbance (in arbitrary units) of HgS nanocrystals obtained. FIG. 12 shows TEM pictures of these HgS nanocrystals.

HgTe Nanoparticles Characterization:

Electron mobility and hole mobility in HgTe nanoparticle from examples 2 and 3 and from comparative example C1 have been characterized with the following method.

An Electrolyte-Gated Field Effect Transistor (EG-FET) is prepared in which channel contains HgTe nanoparticles.

Electrode Fabrication

Electrodes are fabricated using standard optical lithography methods. Surface of a Si/SiO2 (400 nm thick) wafer is cleaned by sonication in acetone. The wafer is rinsed with isopropanol and finally cleaned using a O$_2$ plasma. AZ5214 resist is spin-coated and baked at 110° C. for 90 second. The substrate is exposed under UV through a pattern mask for 2 s. The film is further baked at 125° C. for 2 min to invert the resist. Then a 40 second flood exposure is performed. The resist is developed using a bath of AZ726 for 32 second, before being rinsed with pure water. Then a 3 nm Cr layer and a 40 nm gold layer are deposited using a thermal evaporator. The lift-off is performed by dipping the film for 1 h in acetone. Electrodes are finally rinsed using isopropanol and dried by air flow. The electrodes are 2 mm long and spaced by 20 μm.

Electrolyte Preparation 500 mg of LiClO4 are mixed with 2.3 g of polyethyleneglycol (PEG) on a hot plate in an Argon filled glove box at 170° C. for 2 h.

Electrolyte Gated Transistor Fabrication

S$^{2-}$ anions are added in the solution of HgX nanoparticles to exchange ligands on the nanoparticles surface. Then HgX nanoparticles are dispersed in N-methylformamide (NMFA) and dropcasted onto the electrodes on a hot plate at 100° C. so that NMFA evaporates, yielding a dense film of HgX nanoparticles. Thickness of the film is controlled by concentration of HgX nanoparticles in NMFA (typically from 10 g/L to 100 g/L) and volume of NMFA solution dropcasted. Meanwhile the electrolyte is softened at 100° C. until it becomes clear and is brushed on the HgX nanoparticles film. A copper grid is then deposited on the top of the electrolyte and used as gate.

For all nanoparticles, EG-FET performance is evaluated: current flowing from source electrode to drain electrode (I$_{DS}$) is recorded as a function of potential imposed between gate electrode and source electrode (V$_{GS}$). From this voltage-current characteristics and geometry of channel, one can determine charge mobility in the channel. In all experiments, current flowing from gate electrode to drain electrode is measured to ensure that leakage current remains negligible.

For instance, with HgTe nanoparticles of Example 3 (salt-route) obtained at 100° C., voltage-current characteristics is shown on FIG. 13B-F, When V$_{GS}$ is positive, I$_{DS}$ is almost zero, showing that mobility of electrons in HgTe nanoparticles is very low. On the other hand, when V$_{GS}$ is negative and decreased, I$_{DS}$ is increasing, showing that mobility of holes in HgTe nanoparticles is high. This HgTe nanoparticle is typically a p-type semiconductor, and mobility of electrons is about 15 times lower than mobility of holes, yielding a ratio of electron mobility and hole mobility of about 0.06.

Figure 13:
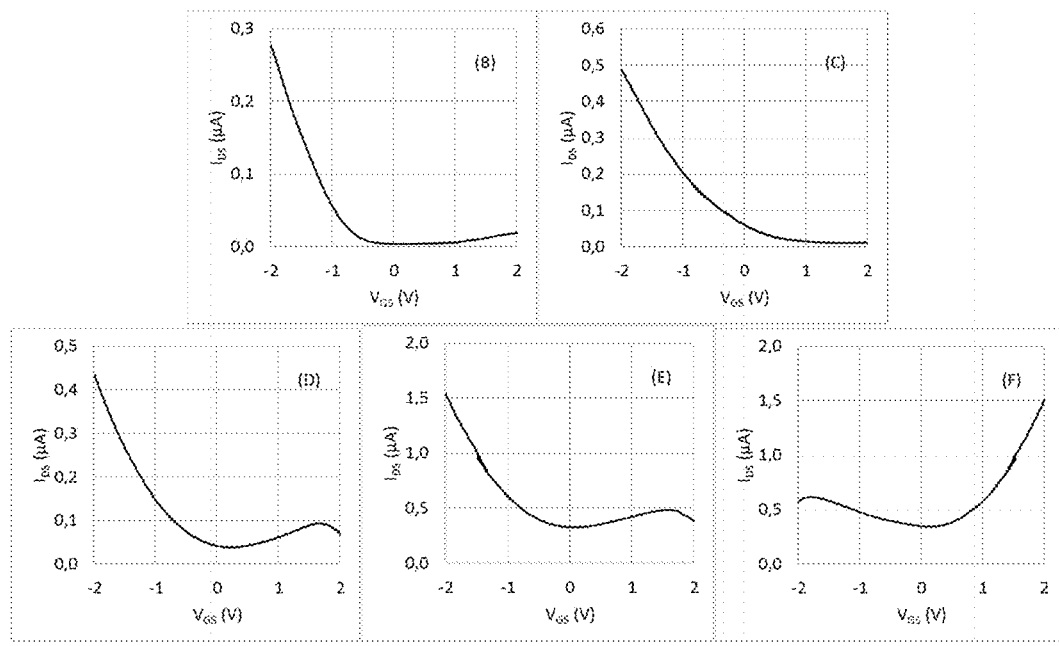
FIG. 13 shows current-voltage characteristics of EG-FET containing HgTe nanoparticles obtained via salt-route for temperatures of 100° C. (B), 120° C. (C), 150° C. (D), 180° C. (E) and 200° C. (F).

FIGS. 13 B-F present voltage-current characteristics of HgTe nanoparticles prepared in example 2 (salt-route), for different temperature. Nanoparticles of FIGS. 13B to 13E are really p-type semiconductors. In particular, nanoparticles of FIGS. 13D and 13E have a confinement energy less than 4500 cm$^{-1}$ (4370 cm$^{-1}$ and 2770 cm$^{-1}$) and have a ratio of electron mobility and hole mobility less than 0.1.

Figure 14:
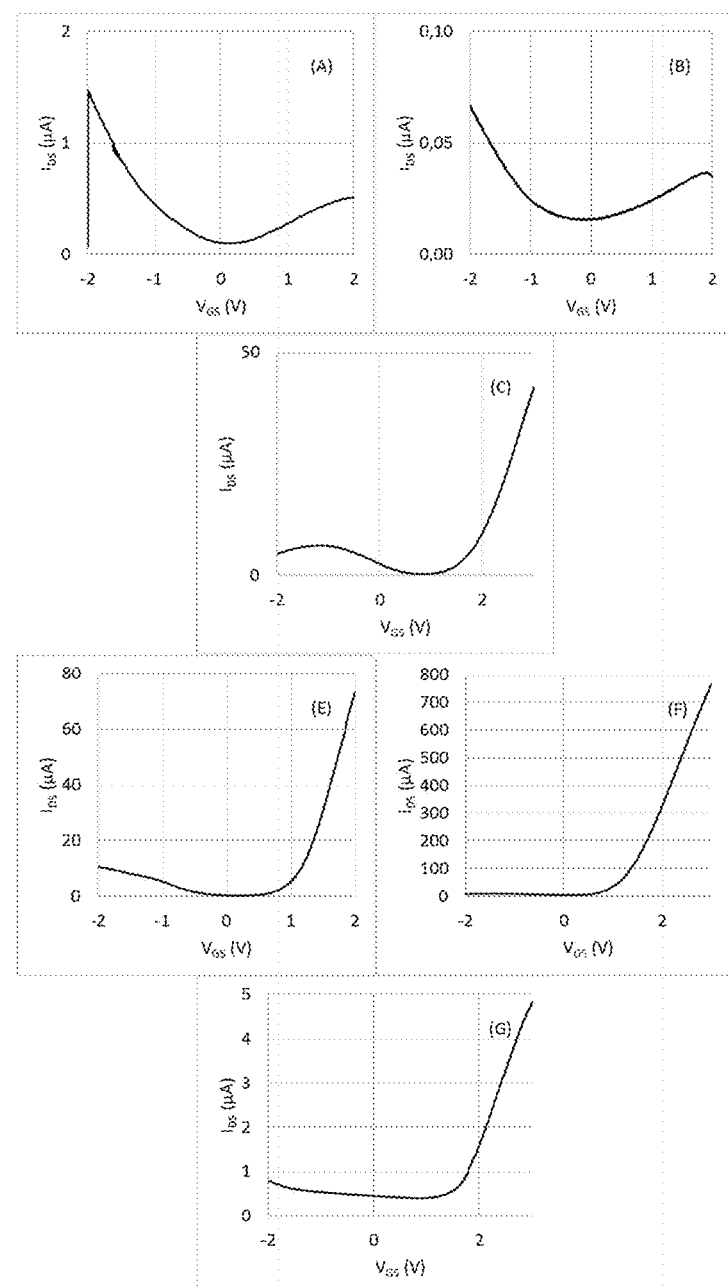
FIG. 14 show current-voltage characteristics of EG-FET containing HgTe nanoparticles obtained via liquid mercury route for temperatures of 50° C. (A), 70° C. (B), 80° C. (C), 100° C. (E), 120° C. (F) and 150° C. (G).

FIGS. 14 A-G present voltage-current characteristics of HgTe nanoparticles prepared in example 3 (liquid Mercury route), for different temperature. Nanoparticles of FIGS.

14C to 14G are really n-type semiconductors. In particular, nanoparticles of FIGS. 14C and 14E have a confinement energy greater than 5000 cm$^{-1}$ (5200 cm$^{-1}$ and 5880 cm$^{-1}$) and have a ratio of electron mobility and hole mobility greater than 5.

Figure 15:
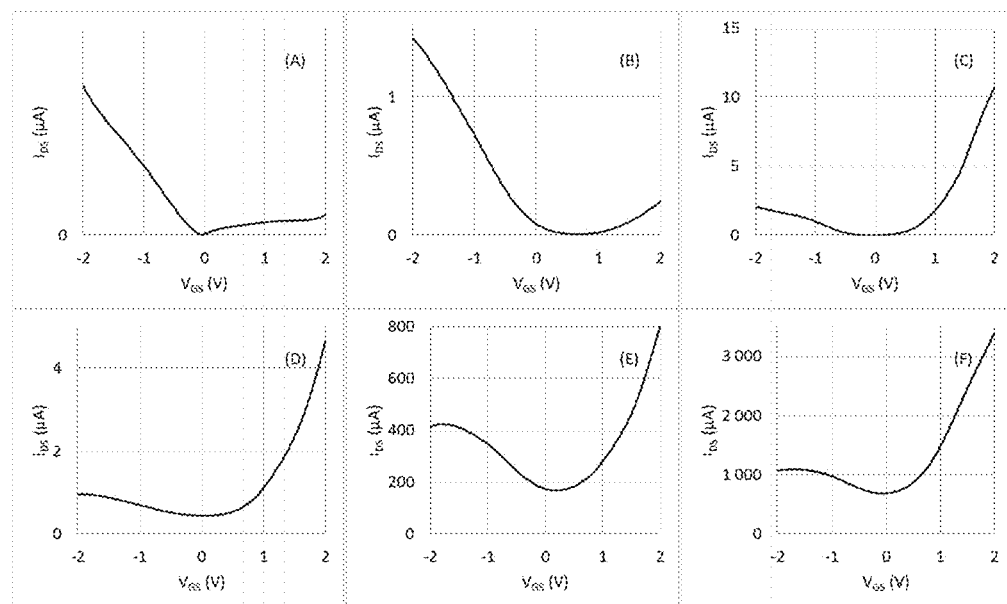
FIG. 15 show current-voltage characteristics of EG-FET containing HgTe nanoparticles obtained from mercury chloride for temperatures of 50° C. (A), 60° C. (B), 80° C. (C), 90° C. (D), 110° C. (E) and 120° C. (F).

FIG. 15 A-F present voltage-current characteristics of HgTe nanoparticles prepared in comparative example C1, for different temperature. In comparative example, HgTe nanoparticles present ambipolar behavior, which does not provide suitable material to produce n-type or p-type conductors.

Figure 16:
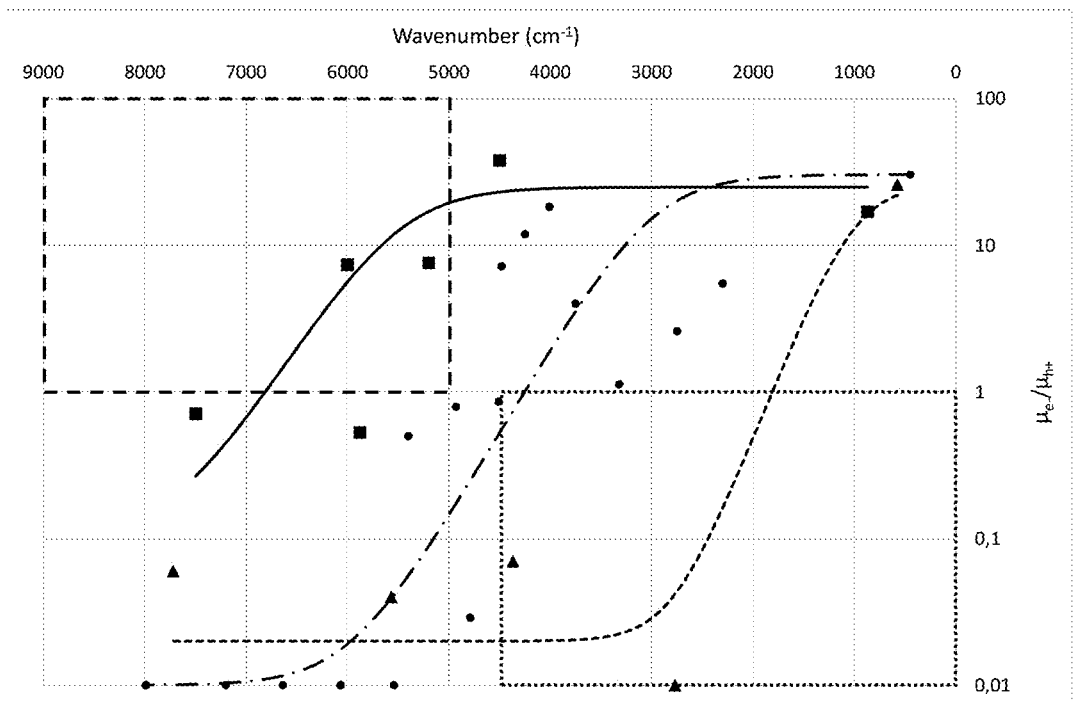
FIG. 16 presents ratio of electron mobility ($\mu_{e-}$) and hole mobility ($\mu_{h+}$) for HgTe nanoparticles obtained by salt-route (triangles and dotted fitting line), liquid mercury route (squares and continuous fitting line) and from mercury chloride (circles and semi-dotted fitting line), nanoparticles being defined by their confinement energy (cm$^{-1}$). The domains of HgTe-n and HgTe-p nanoparticles are illustrated by a dashed square and a dotted square respectively.

FIG. 16 shows ratio of electron mobility and hole mobility for all HgTe nanoparticles prepared in examples 2 and 3 and comparative example C1, as a function of confinement energy, i.e. as a function of nanoparticle size.

For each series of synthesis, a sigmoid curve shows transition from large particles (low confinement energy) of n-type to small particles (large confinement energy) of p-type when ratio of electron mobility and hole mobility equals 1. In comparative example C1, this transition is located at 4250 cm$^{-1}$. Roughly, particles with confinement energy less than 4250 cm$^{-1}$ are n-type and particles with confinement energy greater than 4250 cm$^{-1}$ are p-type Surprisingly, small HgTe nanoparticles, i.e. with a confinement energy greater than 5000 cm$^{-1}$, show a ratio of electron mobility and hole mobility greater than 1 (HgTe-n). These n-type semiconducting nanoparticles (FIGS. 14C and 14E) are particularly interesting as they show a selective response to infrared light: such nanoparticles are useful to design optoelectronic devices.

Similarly, large HgTe nanoparticles, i.e. with a confinement energy less than 4500 cm$^{-1}$, show a ratio of electron mobility and hole mobility less than 1 (HgTe-p), yielding interesting p-type semiconducting nanoparticles (FIGS. 13D and 13E).

In particular, for a range of infrared light around 2 μm (5000 cm$^{-1}$), newly obtained nanoparticles allow to prepare efficient p-n junctions, for instance by deposition of a first layer of HgTe-p nanoparticles then deposition of a second layer of HgTe-p nanoparticles. Extension of infrared light in which such p-n junction are efficient is actually the range between the transition threshold for HgTe nanoparticles obtained via liquid mercury route (1.33 μm-6800 cm$^{-1}$) and transition threshold for HgTe nanoparticles obtained via salt route (5 μm-2000 cm$^{-1}$).

The invention claimed is:

1. A method of preparation of HgX nanoparticles comprising the steps of providing a precursor of Hg and mixing said precursor of Hg with a precursor of X at a temperature of ranging from 50° C. to 200° C., wherein precursor of Hg is a Hg thiolate and X is a chalcogenide.

2. The method according to claim 1, wherein mixing is done in a coordinating solvent.

3. The method according to claim 2, wherein the coordinating solvent is an amine.

4. The method according to claim 3, wherein the coordinating solvent is an oleylamine.

5. The method according to claim 1, wherein X is a chalcogenide selected from Te, Se and S.

6. The method according to claim 5, wherein X is Te.

7. The method according to claim 1, wherein precursor of X is selected from trioctylphosphine telluride, $(NH_4)_2S$ and elemental Se.

8. The method according to claim 1, wherein Hg thiolate is a salt of Hg at oxidation state +II.

9. The method according to claim 1, wherein Hg thiolate is prepared by reaction of liquid Hg with thiol.

10. The method according to claim 9, wherein an oxidizing agent is added during reaction of liquid Hg with thiol.

11. HgTe nanoparticles having a confinement energy greater than 5000 cm$^{-1}$ and having a ratio of electron mobility and hole mobility greater than 1.

12. HgTe nanoparticles according to claim 11, wherein HgTe nanoparticles surface is capped with thiols.

13. HgTe nanoparticles according to claim 11, having a ratio of electron mobility and hole mobility greater than 5.

14. HgTe nanoparticles having a confinement energy less than 4500 cm$^{-1}$ and having a ratio of electron mobility and hole mobility less than 1.

15. HgTe nanoparticles according to claim 14, wherein HgTe nanoparticles surface is capped with thiols.

16. HgTe nanoparticles according to claim 14, having a ratio of electron mobility and hole mobility less than 0.1.

17. An optoelectronic device comprising the HgTe nanoparticles according to claim 11, wherein the optoelectronic device is selected from an IR photodetector, an IR photoconversion device, an IR filter or an IR photodiode.

18. An optoelectronic device comprising HgTe nanoparticles according to claim 14, wherein the optoelectronic device is selected from an IR photodetector, an IR photoconversion device, an IR filter or an IR photodiode.

19. An optoelectronic device comprising HgTe nanoparticles according to claim 12, wherein the optoelectronic device is selected from an IR photodetector, an IR photoconversion device, an IR filter or an IR photodiode.

20. An optoelectronic device comprising HgTe nanoparticles according to claim 15, wherein the optoelectronic device is selected from an IR photodetector, an IR photoconversion device, an IR filter or an IR photodiode.

* * * * *